United States Patent [19]
Lattimore et al.

[11] Patent Number: 6,134,164
[45] Date of Patent: Oct. 17, 2000

[54] SENSING CIRCUIT FOR A MEMORY CELL ARRAY

[75] Inventors: George McNeil Lattimore; Gus Wai-Yan Yeung, both of Austin, Tex.

[73] Assignee: International Business Machines Corp., Armonk, N.Y.

[21] Appl. No.: 09/296,876

[22] Filed: Apr. 22, 1999

[51] Int. Cl.[7] .................................................. G11C 7/00
[52] U.S. Cl. ............................................ 365/205; 365/190
[58] Field of Search ..................................... 365/205, 190, 365/207, 204, 202, 230.6; 327/51

[56] References Cited

U.S. PATENT DOCUMENTS

| | | | |
|---|---|---|---|
| 5,504,443 | 4/1996 | Gross et al. | 327/51 |
| 5,561,630 | 10/1996 | Katoh et al. | 365/189.01 |
| 5,604,705 | 2/1997 | Acklang et al. | 365/205 |
| 5,764,589 | 6/1998 | Lofti | 365/230.06 |

*Primary Examiner*—David Nelms
*Assistant Examiner*—David Lam
*Attorney, Agent, or Firm*—Kelly K. Kordzik; Winstead Sechrest & Minick P.C.; Anthony V.S. England

[57] ABSTRACT

The present invention addresses the foregoing need by providing a memory sensing circuit for accelerating a logic level transition of the complementary memory bit line of a complementary bit line pair having a full logic swing. The memory sensing circuit has a dual-rail circuit and at least one slew-rate acceleration circuit. The dual-rail circuit can be coupled across the complementary bit line pair for conditioning a signal undergoing a logical state transition placed on either of the bit lines. The at least one slew-rate acceleration circuit is coupled to the dual-rail circuit. The conditioned signal is input to the slew-rate acceleration circuit, said slew-rate acceleration circuit having an inverter circuit with an input terminal to receive the conditioned signal. A feed-back loop transistor, having a gate terminal coupled to an output terminal of the inverter circuit is responsive to an output signal placed on the output terminal such that the slew-rate of the conditioned signal is accelerated.

20 Claims, 3 Drawing Sheets

SENSING CIRCUIT FOR A MEMORY CELL ARRAY

TECHNICAL FIELD

The present invention relates in general to integrated circuits, and in particular, to bit line sense and latch circuitry for memory cell arrays used as embedded memory for microprocessor circuits.

BACKGROUND INFORMATION

Conventional DRAM ("Dynamic Random Access Memory") and SRAM ("Static Random Access Memory") bit line sense and latch circuitry has been designed to sense small voltage thresholds arising from the use of either very small memory cells in the case of DRAM or very fast sensing in the case of SRAM. These memory cells are noise sensitive, requiring special physical layout precautions that are painstakingly taken to avoid signal errors when sensing the activation of a bit-line-true ("BLT") or bit-line-complementary ("BLC") of the memory cells and accompanying select circuitry. Generally, a memory cell supplies a read signal through the bit line pair. The signal is sensed, amplified, and transferred to a suitable evaluation circuit such as an array column decoder.

But using the sensing amplifier to overcome noise issues has required a timing signal, or in the alternative, has required static power to maintain the sensing amplifier in an active state. Thus, either a complex circuit has been required for an amplifier/timing signal combination, or an additional power requirement to maintain the sensing amplifier in that active state. In either configuration, power consumption is increased for the circuit overall, as well as the heat output of the circuit.

Increased complexity is also undesirable because of a cascading complexity effect for circuit design. For example, parasitic capacitances are created, compounding speed and electronic noise design hurdles. Also, the noise effects have been further compounded combining memory cell structures with high speed logic applications, such as has been present on embedded memory in microprocessor circuits.

Higher operational speeds are also sought with respect to processor operation. One technique to try to achieve this speed has been to embed a discrete memory circuit on a chip with high-speed processor circuits. But placing memory cells adjacent a processor circuit has not necessarily translated to faster data transmission rates.

Thus, a need exists for a simple sensing circuit for a semiconductor memory structure that does not rely on a timing signal to function, yet is noise tolerant. Also needed is a sensing circuit that actively accelerates the logic state transition slew rate of a memory bit line, thus achieving a higher operational speed of the memory structure.

BRIEF SUMMARY OF THE INVENTION

The present invention addresses the foregoing need by providing a memory sensing circuit for accelerating a logic level transition of the complementary memory bit line of a complementary bit line pair having a full logic swing. The memory sensing circuit has a dual-rail circuit and at least one slew-rate acceleration circuit. The dual-rail circuit can be coupled across the complementary bit line pair for conditioning a signal undergoing a logical state transition placed on either of the bit lines. The slew-rate acceleration circuit is coupled to the dual-rail circuit. The conditioned signal is input to the slew-rate acceleration circuit, the slew-rate acceleration circuit having an inverter circuit with an input terminal to receive the conditioned signal. A feedback loop transistor, having a gate terminal coupled to an output terminal of the inverter circuit is responsive to an output signal placed on the output terminal such that the slew-rate of the conditioned signal is accelerated.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
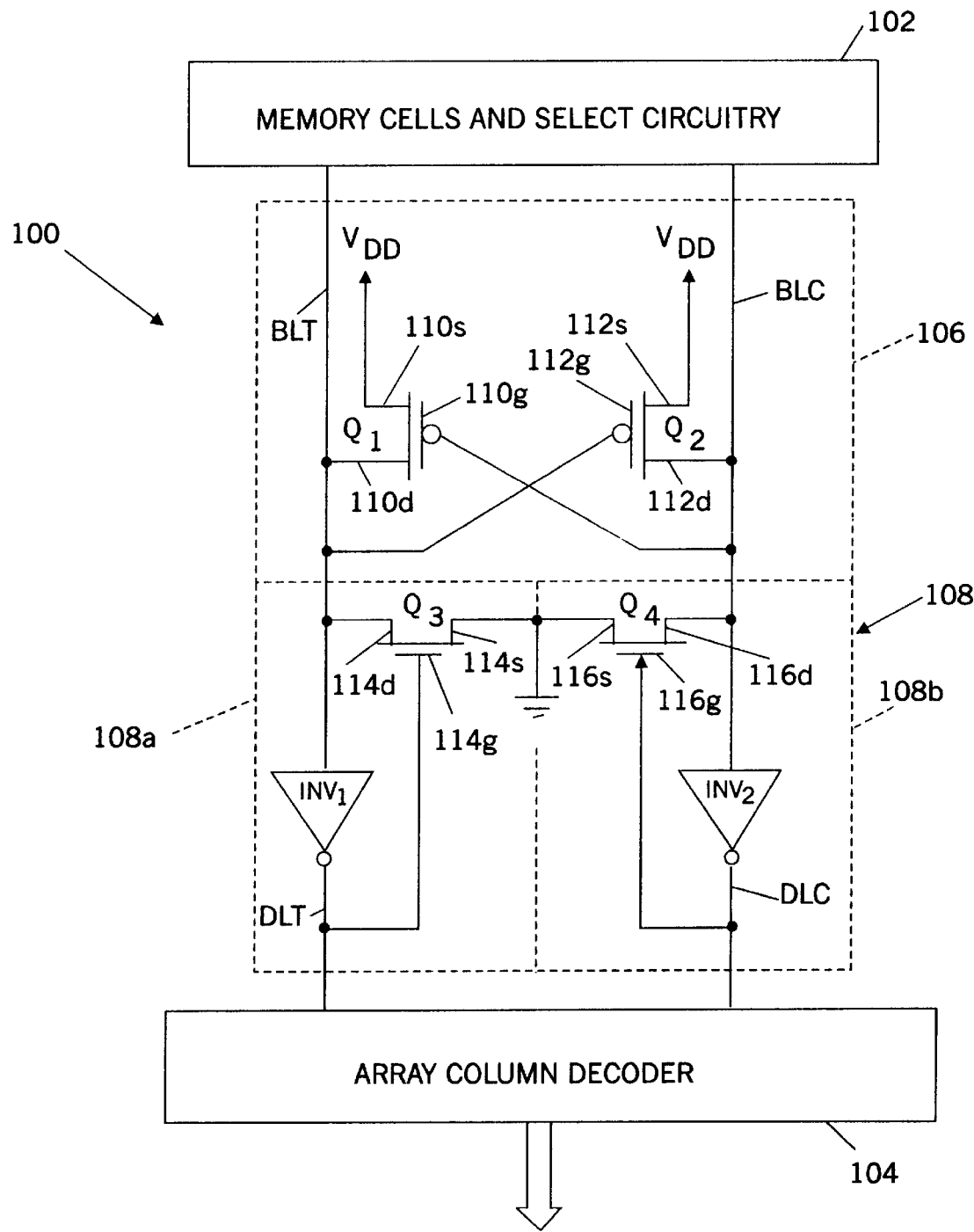
FIG. 1 is a circuit level schematic of the sensing circuit of the present invention.

In the following description, numerous specific details are set forth to provide a thorough understanding of the present invention. It should be noted, however, that those skilled in the art are capable of practicing the present invention without such specific details. In other instances, well-known circuits have been shown in block diagram form in order not to obscure the present invention in unnecessary detail.

Referring to the drawings, depicted elements are not necessarily shown to scale, and like or similar elements are designated by the same reference numeral through the several views.

It will be understood for this description that the present invention is for implementation in semiconductor materials such as a microcircuit structure using conventional MOSFET ("Metal Oxide Semiconductor Field Effect Transistor") technology, as well as SOI ("Silicon-on-Insulator") technology or other semiconductor technologies, as they become available.

FIG. 1 is a circuit level schematic of the sensing circuit 100 of the present invention. The sensing circuit 100 is electrically coupled to memory-cell-and-select-circuit 102, and an array column decoder 104, both of which are known to those skilled in the art. The components described herein have terminals for receiving electrical signals transmitted over electrical signal conductors. The electrical signal conductors can be semiconductor pathways, or electrical runs or wire, having the capacity to accommodate electrical current and voltages that are representative of the electrical signal.

The term "couple" as used herein means to bring electric circuits into such close proximity as to permit mutual influences, and that such coupling can be through capacitance, induction, buffering, or other such electrical design techniques that do not affect the spirit and scope of the present invention.

The memory-cell-and-select-circuit 102 provides for the electronic storage of information. The memory cells are a semiconductor-based memory array that can be read and written by a microprocessor or other hardware devices. The storage locations in a memory array can be accessed in any order.

The simplest and highest-density memory is the DRAM, which are implemented by storing charge on a capacitor to represent a logic "1" or "0" value level. The charge is stored and sensed by a pass-gate MOSFET to write or read the memory capacitor cell. The memory consists of an array of these cells, together with the select circuitry that permit random-access addressing of memory cells in the array. Because the capacitor slowly discharges (that is, loses its information), the memory must be "refreshed" frequently to restore the charge to its intended value, hence the name dynamic memory.

The present invention may be deployed with a memory-cell-and-select-circuit 102 having a plurality of dynamic memory cells due to the high-density, high performance implementation that achieves reduced circuit delay and reduced silicon area.

The memory size contemplated by the present invention is for those memories in which the bit lines BLT and BLC can have a full logic swing, which in present devices is typically from about 100 milli-Volts (mV) to about 300 mV between a logic level "1" and a logic level "0." For example—and without taking into account memory cell architecture design techniques that can influence memory array performance—memory arrays with this characteristic are generally on the order of 32 kilobytes of memory or less. Electronic memories of this size are typically utilized in cache memory, or embedded memories for a memory sub-system in which frequently used data values are duplicated for quick access.

Memory cell circuits are further discussed in greater detail in Sung-Mo Kang & Yusuf Leblebici, *CMOS Digital Integrated Circuits*, pp. 379–431 (McGraw-Hill Book Co. 1996), and in U.S. Pat. No. 5,784,311, issued Jul. 21, 1998 to Assaderaghi et al., which are incorporated by reference herein. Again, it should be noted that the bit line sensing circuit 100 is not limited to any particular material structure. For example, the present invention can be used in CMOS ("Complementary Metal-Oxide Semiconductor") applications and SOI ("Silicon-on-Insulator") applications.

The array column decoder 104 is a logic circuit used to decode and select a cell in a memory cell array. The term "memory" is understood to refer to semiconductor-based storage devices coupled to a processor, either as an embedded memory or as a discrete semiconductor device. Central to a memory architecture is a memory array having $2^n$ by $2^m$ bits of storage. A row (or word) decoder addresses one word of $2^m$ bits out of $2^n$ words. A column (or bit) decoder addresses $2^k$ of $2^m$ bits of the accessed row. Such a column decoder can access a multiplexer, which routes addressed data to and from interfaces for outside access to the memory cell array. An example of a suitable array column decoder is shown in U.S. Pat. No. 5,764,589, issued Jun. 9, 1998, to Lofti, which is incorporated by reference herein. The column decoder 104 is shown coupled to a single memory cell column for simplicity. It should be noted that the present invention can be deployed in a memory array having a plurality of columns, while coming within the electrical considerations discussed in detail above.

The sensing circuit 100 receives as a signal input through the complementary bit line pair BLT ("Bit Line True") and BLC ("Bit Line Complementary") from the memory-cell-and-select-circuit 102. Because the memory-cell-and-select-circuit 102 is a dynamic memory device, the bit lines BLT and BLC are pre-charged to a logic "1" value level. This technique is known to those skilled in the art.

The pre-charging of the bit lines BLT and BLC plays an important role in that in an un-clocked memory cell array, data from an accessed memory cell develops a voltage difference on the bit lines BLT and BLC. When another memory cell on the same column is accessed next—one that contains data opposite to the data contained in the previously accessed memory cell—the output has to switch first to an equalized state and then to the opposite logic state. Since the capacitance on the bit lines BLT and BLC is large, the time required for switching the voltage differential from one state to the other becomes a significant portion of the overall access time of the memory cells. The pre-charging of the bit lines act to reduce the time for change from a logic "1" value level to a logic "0" value level.

Each of the bit lines BLT and BLC are coupled to an inverter circuit INV1 and INV2, respectively. Each inverter circuit respectively produces an output on a data line output DLT and DLC, which is input to the array column decoder 104 for processing as described above. It should be noted that several different circuits can be implemented to achieve the inversion function of the inverter circuits INV1 and INV2, and that the reference to the use of the term "inverter" is not intended to limit the present application to any one particular inversion circuit.

The sensing circuit 100 has a dual-rail circuit 106 to reduce sensitivity to transient noise. Coupled to the dual-rail circuit 106 is a slew-rate acceleration circuit 108 having legs 108a and 108b to respectively accelerate a state transition across the inverter circuits INV1 and INV2, thereby increasing overall circuit speed.

With both of the bit lines BLT and BLC being pulled-up during the precharge cycle, pMOS transistors Q1 and Q2 are OFF.

The term "dual-rail" refers to the cross-coupling of the transistors Q1 and Q2 across the bit lines BLT and BLC. The drain terminal 112d of transistor Q2 is electrically-coupled to the gate terminal 110g of transistor Q1, and the drain terminal 110d of transistor Q1 is electrically-coupled to the gate terminal 112g of transistor Q2.

The dual-rail circuit 106 is coupled to the bit lines BLT and BLC. The dual-rail circuit 106 has a CMOS transistor Q1 with a gate terminal 110g, a source terminal 110s, and a drain terminal 110d, and a second CMOS transistor Q2 with a gate terminal 112g, a source terminal 112s, and a drain terminal 112d. The label of "source" and "drain" is for referencing connections, and it should also be noted that either of these diffusion regions can function as either a "source" or a "drain" according to the direction of the electric current therethrough.

Transistors Q1 and Q2 are preferably a pMOS device (having an n-type substrate and p+ source and drain regions) to serve as a selective "pull-up" voltage to the bit lines BLT and BLC. The respective source terminals 110s and 112s of the pMOS transistors Q1 and Q2 are coupled to a source voltage VDD. The drain terminal 110d of transistor Q1 is electrically-coupled to the bit line BLT of the memory-cell-and-select-circuit 102. The drain terminal 112d of transistor Q2 is electrically-coupled to the bit line BLC of the memory-cell-and-select-circuit 102.

In effect, the dual-rail circuit 106 conditions electrical signals placed on the bit lines BLT and BLC by reducing the sensitivity of the sensing circuit 100, that is, acting as a virtual filter of electrical noise to improve circuit reliability.

The slew rate acceleration circuit 108, having a first leg 108a and a second leg 108b is coupled across the dual-rail circuit 106. The slew rate acceleration circuit leg 108a has a CMOS transistor Q3, and the slew-rate acceleration circuit leg 108b has a CMOS transistor Q4.

Each transistor Q3 and Q4 preferably has an opposing conductivity-type with respect to transistors Q1 and Q2. Accordingly, transistors Q3 and Q4 are conductivity-type nMOS devices (having a p-type substrate and n+ source and drain regions). CMOS transistor Q3 has a gate terminal 114g, a source terminal 114s, and a drain terminal 114d. CMOS transistor Q4 has a gate terminal 116g, a source terminal 116s, and a drain terminal 116d.

The source terminals 114s and 116s are electrically-coupled to a digital ground GND. The drain terminal 1124d of Q3 is electrically-coupled to bit line BLT, and accordingly, to the gate terminal 112g of dual-rail transistor Q2. The drain terminal 116d of Q4 is electrically-coupled to bit line BLC, and accordingly, also to the gate terminal 110g of the dual-rail transistor Q1. The gate terminal 114g of transistor Q3 is coupled to the data line DLT, and the gate terminal 116g of transistor Q4 is coupled to the complementary data line DLC. In this manner, transistor Q3 provides a feedback loop to drive the transition of the bit line BLT and data line DLT, and transistor Q4 provides a feedback loop to drive the transition of the bit line BLC and the data line DLC.

Figure 2:
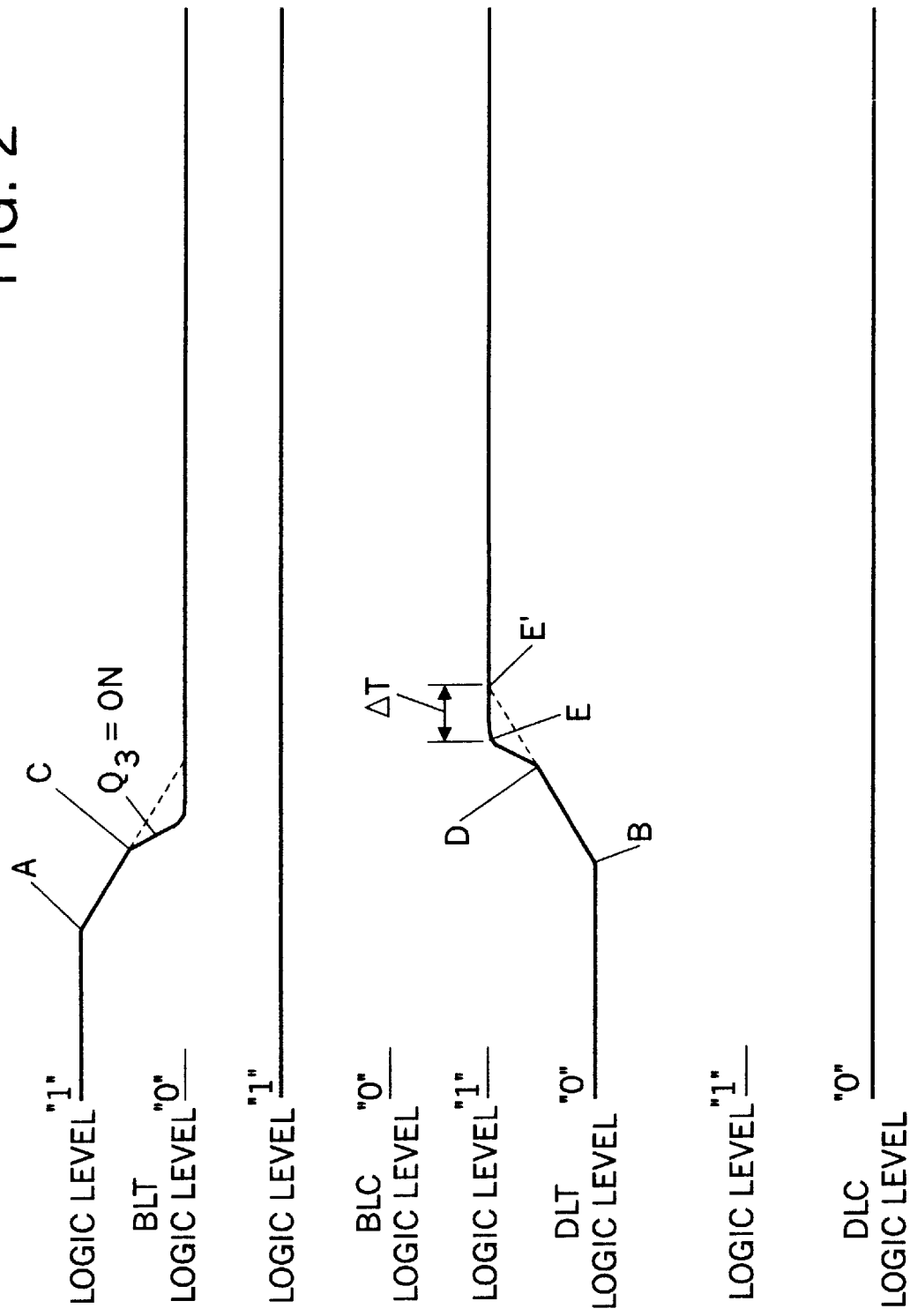
FIG. 2 is a timing diagram of the interaction of the sensing circuit of the present invention on a state transition of a memory bit line.

Referring to FIG. 2, shown is a timing diagram of the interaction of the sensing circuit components upon a state transition on the bit line BLT. As necessary, reference is made back to FIG. 1.

The timing diagram of FIG. 2 does not show an input clock signal, which is not necessary for the sensing circuit of the present invention. Eliminating reliance on an input clock signal reduces the complexity of the sensing circuit of the present invention. This reduced complexity translates to a simplified circuit that occupies less area on a semiconductor wafer, while providing the advantage of increasing the memory speed with respect to the time for logic level transitions to occur. It should be understood that similar effects are achieved with state transitions on the bit line BLC. The pre-charged status of the memory-cell-and-select-circuit 102 initially places the bit lines BLT and BLC at the logic level "1," which is typically the operational voltage $V_{DD}$. Correspondingly, the data lines DLT and DLC are at the logic level "0," which is typically at the operational voltage of the digital ground GND.

In FIG. 2, the voltage level on the bit line BLT starts to drop at point A when the memory cell access transistors of the memory-cells-and-select-circuit 102 are activated. As the logic transition progresses, the pMOS transistor Q2 of the dual-rail circuit 106 is turned ON, maintaining the bit line BLC at the logic level "1."

The inverter circuit INV1 output signal on data line, DLT begins the transition to a logic level "1" state, as indicated at point B. When the transition sufficiently progresses, the nMOS transistor Q3 responds by switching to an ON state through gate terminal 114g, which is coupled to data line DLT.

When the nMOS transistor Q3 is ON, the bit line BLT is effectively coupled to the ground GND through the drain terminal 114d and the source terminal 114s. The effect on the bit line BLT is shown at point C of FIG. 2. The coupling with the ground GND increases the slope of the transition of the bit line BLT to the logic level "0." In response, the data line DLT slope is likewise increased at point D. The phantom lines of FIG. 2 serve to better illustrate the effect of coupling the bit line BLT to ground GND across the nMOS transistor Q3. As shown, the amount of time for the transition to take place on the data line DLT is reduced by a reduction factor ΔT, which is the time difference between point E and point E'.

Figure 3:
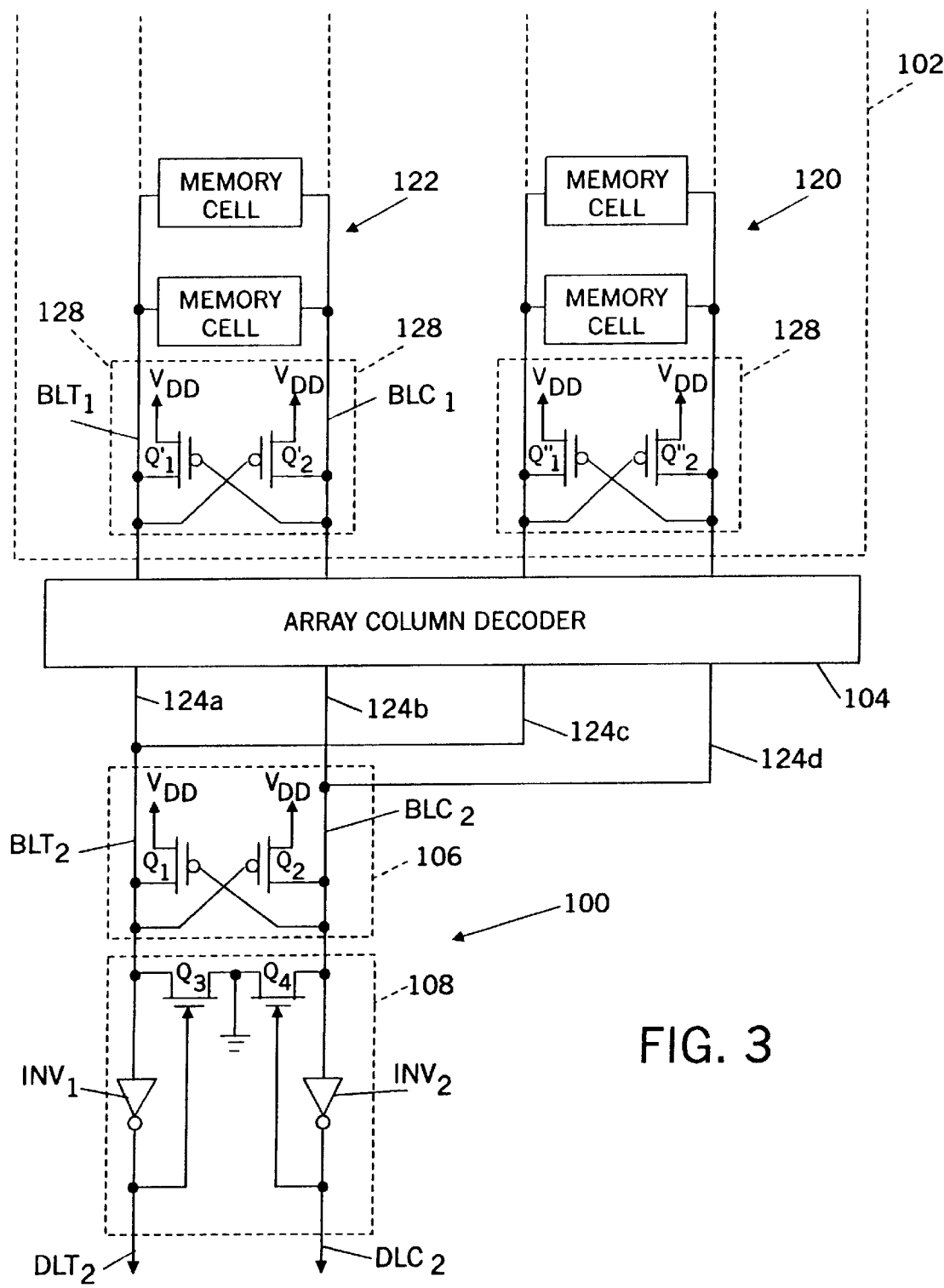
FIG. 3 is a circuit level schematic of the sensing circuit of the present invention deployed in another embodiment.

FIG. 3 shows another embodiment of the sensing circuit 100 deployed in a different memory configuration. As shown, the memory-cell-and-select-circuit 102 is coupled to the array column decoder 104 through bit lines BLT and BLC from a first memory column 120, and bit lines $BLT_1$ and $BLC_1$ from a second memory column 122. The memory-cell-and-select-circuit 102 is shown in phantom lines to indicate that larger memory structures can be deployed beyond the two memory cell columns 120 and 122. Also, dual-rail circuits 128 are shown used in a conventional manner across the bit lines of the respective memory columns 120 and 122. The dual-rail circuits 128 of themselves, however, do not provide the benefits and advantages of the sensing circuit 100 of the present invention as described in detail herein.

The output terminals 124a, 124b, 124c, and 124d of the array column decoder 104 are coupled to the sensing circuit 100. As shown, the decoder output terminals 124a and 124c are coupled to the bit line $BLT_2$, and the decoder output terminals 124b and 124d are coupled to the bit line $BLC_2$. The sensing circuit 100 is coupled across the bit lines $BLT_2$ and $BLC_2$. The slew-rate acceleration circuit 108 stage has a similar affect on an output signal output to the data lines $DLT_2$ and $DLC_2$ as discussed above with respect to FIGS. 1 and 2.

Although the present invention and its advantages have been described in detail, it should be understood that various changes, substitutions and alterations can be made herein without departing from the spirit and scope of the invention as defined by the appended claims.

What is claimed is:

1. A memory sensing circuit for accelerating a logic level transition of a memory bit line of a complementary bit line pair having a true bit line and a complement bit line, each of the bit lines having a full logic swing, the memory sensing circuit comprising:

a dual-rail circuit to couple across the complementary bit line pair for conditioning a signal undergoing a logical state transition placed on either of the bit lines; and at least one slew-rate acceleration circuit coupled to said dual-rail circuit such that said conditioned signal is input to said slew-rate acceleration circuit, said slew-rate acceleration circuit having an inverter circuit with an input terminal to receive said conditioned signal, and having a feed-back loop transistor having a gate terminal coupled to an output terminal of said inverter, said feed-back loop transistor being responsive to an output signal placed on said output terminal for accelerating a slew-rate of said conditioned signal undergoing a state transition.

2. The memory sensing circuit of claim 1, further comprising:

an array column decoder having an input terminal coupled to said output terminal of said inverter circuit for decoding and for selecting a cell in an array of memory cells.

3. The memory sensing circuit of claim 1 wherein the complementary bit line pair is provided by an output terminal of an array column decoder.

4. The memory sensing circuit of claim 1, wherein the dual-rail circuit comprises:

a first transistor having a drain terminal coupled to the true bit line, a gate terminal coupled to the complementary bit line, and a source terminal for coupling to a logic level value; and a second transistor having a drain terminal coupled to the complementary bit line, a gate terminal coupled to the true bit line, and a source terminal for coupling to said logic level value.

5. The memory sensing circuit of claim 4, wherein said first and said second transistor are pMOS transistors, and said logic level value is $V_{DD}$.

6. The memory sensing circuit of claim 1 wherein said feed-back loop transistor is an nMOS transistor having a source terminal coupled to a ground voltage.

7. A semiconductor memory circuit comprising:

at least one memory column having a plurality of memory cells, said at least one memory column having a complementary bit line pair with a true bit line and a complement bit line, each of said bit lines having a full logic swing;

a dual-rail circuit to couple across the complementary bit line pair for conditioning a signal undergoing a logical state transition placed on either of the bit lines; and at least one slew-rate acceleration circuit coupled to said dual-rail circuit such that said conditioned signal is input to said slew-rate acceleration circuit, said slew-rate acceleration circuit having an inverter circuit with an input terminal to receive said conditioned signal, and having a feed-back loop transistor having a gate terminal coupled to an output terminal of said inverter, said feed-back loop transistor being responsive to an output signal placed on said output terminal for accelerating a slew-rate of said conditioned signal undergoing a state transition.

8. The semiconductor memory circuit of claim 7 further comprising:

an array column decoder having an input terminal coupled to said output terminal of said inverter for decoding and for selecting a cell of an array of memory cells.

9. The semiconductor memory circuit of claim 7 wherein the complementary bit line pair is provided by an output terminal of an array column decoder.

10. The semiconductor memory circuit of claim 7, wherein the dual-rail circuit comprises:

a first transistor having a drain terminal coupled to the true bit line, a gate terminal coupled to the complementary bit line, and a source terminal for coupling to a logic level value; and a second transistor having a drain terminal coupled to the complementary bit line, a gate terminal coupled to the true bit line, and a source terminal for coupling to said logic level value.

11. The semiconductor memory circuit of claim 10, wherein said first and said second transistor are pMOS transistors, and said logic level value is $V_{DD}$.

12. The semiconductor memory circuit of claim 10 wherein said feed-back loop transistor is an nMOS transistor having a source terminal coupled to a ground voltage.

13. A method for accelerating a logic level transition of a memory bit line of a complementary bit line pair, the method comprising the steps of:

conditioning an electrical signal transmitted on the memory bit line with a dual-rail circuit coupled across the complementary bit line pair; and accelerating the conditioned signal through the logic level transition with a transistor that electrically couples the memory bit line to a logic level voltage reference in response to the logic level transition.

14. The method of claim 13 wherein the dual-rail circuit comprises:

a first transistor having a drain terminal coupled to the true bit line, a gate terminal coupled to the complementary bit line, and a source terminal for coupling to a logic level value; and a second transistor having a drain terminal coupled to the complementary bit line, a gate terminal coupled to the true bit line, and a source terminal for coupling to said logic level value.

15. The method of claim 14 wherein the first and the second transistor are pMOS transistors, and the logic level value is $V_{DD}$.

16. The method of claim 13 wherein the transistor is an nMOS transistor having a source terminal coupled to the logic-level voltage reference is a ground voltage.

17. The method of claim 16 wherein the logic-level voltage reference is a ground voltage.

18. A memory sensing circuit for a semiconductor circuit having at least one memory column with a plurality of memory cells, the at least one memory column having a complementary bit line pair with a true bit line and a complement bit line, each of the bit lines having a full logic swing, the memory sensing circuit comprising:

means for conditioning an electrical signal transmitted on the memory bit line; and means for accelerating said conditioned signal through a logic level transition to a logic level voltage reference in response to said logic level transition.

19. The memory sensing circuit of claim 18 wherein said conditioning means is a dual-rail circuit coupled across the complementary bit line pair.

20. The memory sensing circuit of claim 18 wherein said accelerating means is a transistor electrically coupling said memory bit line to said logic-level voltage reference in response to said logic level transition.

* * * * *